(12) United States Patent
Huang

(10) Patent No.: US 7,236,365 B1
(45) Date of Patent: Jun. 26, 2007

(54) RECEPTACLE FOR A CENTRAL PROCESSING UNIT

(76) Inventor: Huang-Chou Huang, No. 377, Fu-Teh First Rd., Hsi-Chih, Taipei Hsien (TW)

(*) Notice: Subject to any disclaimer, the term of this patent is extended or adjusted under 35 U.S.C. 154(b) by 0 days.

(21) Appl. No.: 11/303,226

(22) Filed: Dec. 15, 2005

(51) Int. Cl.
*H05K 7/20* (2006.01)
(52) U.S. Cl. .................................................. 361/704
(58) Field of Classification Search ................ 361/704, 361/719, 707; 174/16.1, 16.3; 165/80.3, 165/104.33; 257/706, 718, 719

See application file for complete search history.

(56) References Cited

U.S. PATENT DOCUMENTS 6,208,515 B1 * 3/2001 Klein ......................... 361/704

* cited by examiner

*Primary Examiner*—Javaid H. Nasri
(74) *Attorney, Agent, or Firm*—James H. Walters

(57) ABSTRACT

A receptacle for a CPU has a seat, a cover, a heat sink, and multiple fastening members. The seat is mounted on a motherboard, and a recess is defined in the seat with multiple flexible metal pins provided therein. Multiple resilient members are mounted in the recess. The cover is mounted on the resilient members and can slide in the recess. The heat sink is mounted on the seat, contacting the CPU and secured by the fastening members. The receptacle of this design omits the metal housing, has a heat dissipation capability, and can help reduce the cost of a computer.

5 Claims, 3 Drawing Sheets

RECEPTACLE FOR A CENTRAL PROCESSING UNIT

BACKGROUND OF THE INVENTION

1. Field of the Invention

The present invention relates to a CPU (central processing unit) receptacle, and particularly relates to a CPU receptacle that can protect metal pins in the receptacle and dissipate heat generated from the CPU.

2. Description of the Related Art

Computer motherboards on the market today have at least one receptacle for a CPU. Different types of CPUs require different types of receptacles.

Generally, a CPU receptacle has multiple pin slots to receive the corresponding pins of a CPU. The big processor manufacturer Intel produces a CPU receptacle, LGA775, for its newest product, the Pentium 4 CPU. The LGA 775 is different from conventional receptacles. It has a metal housing with a seat defined therein, and multiple flexible metal pins are provided on the seat that correspond to the metal contacts of the CPU. A cover is pressed on the housing to fix the CPU securely in the housing.

However, when a CPU is mounted in a receptacle, the flexible metal pins in the receptacle can be easily deformed or damaged by the CPU if too much force is used to mount or secure the CPU to the seat.

In addition, CPUs always require additional heat sinks, as does the Pentium 4. Heat sinks usually always contain expensive elements or compounds, and accordingly increases the cost of a computer.

Therefore, the present invention provides a receptacle for a CPU to mitigate or obviate the aforementioned problems.

SUMMARY OF THE INVENTION

The main objective of the present invention is to provide a receptacle for a CPU comprising a seat, a cover, a heat sink, and multiple fastening members.

In this receptacle design, the seat serves as the inner seat of a LGA775 receptacle, and the metal housing is omitted to reduce the cost. The CPU cannot seriously damage the flexible metal pins on the seat. The heat sink also serves as a cover, and is equal to the cover of the LGA775 receptacle, in additional to its function of dissipating heat. The receptacle of this invention can take the place of a conventional LGA775 receptacle and a required additional heat sink, and reduce computer cost accordingly.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
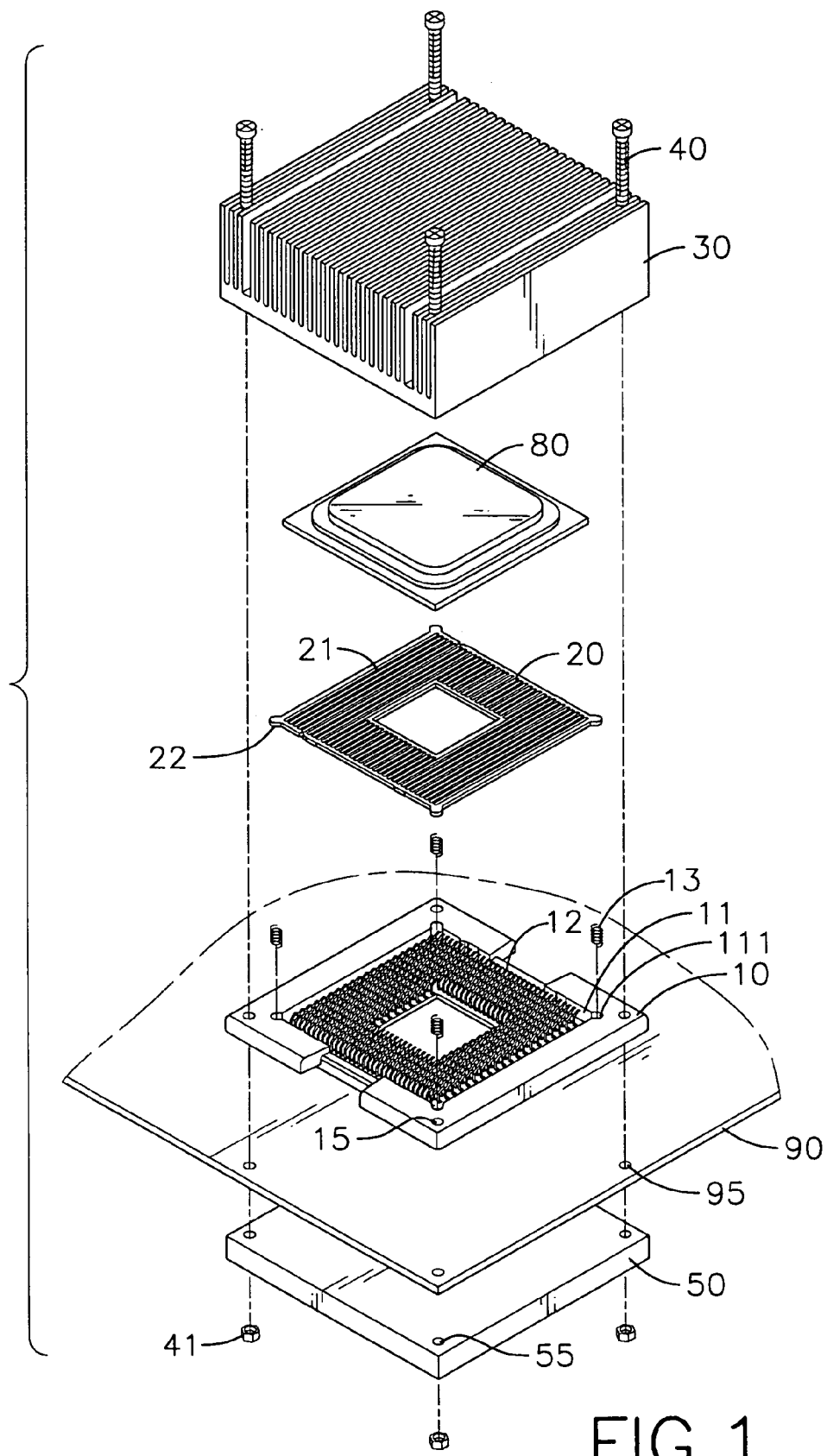
FIG. 1 is an exploded perspective view of a CPU receptacle in accordance with this invention mounted on a computer motherboard.
Figure 2:
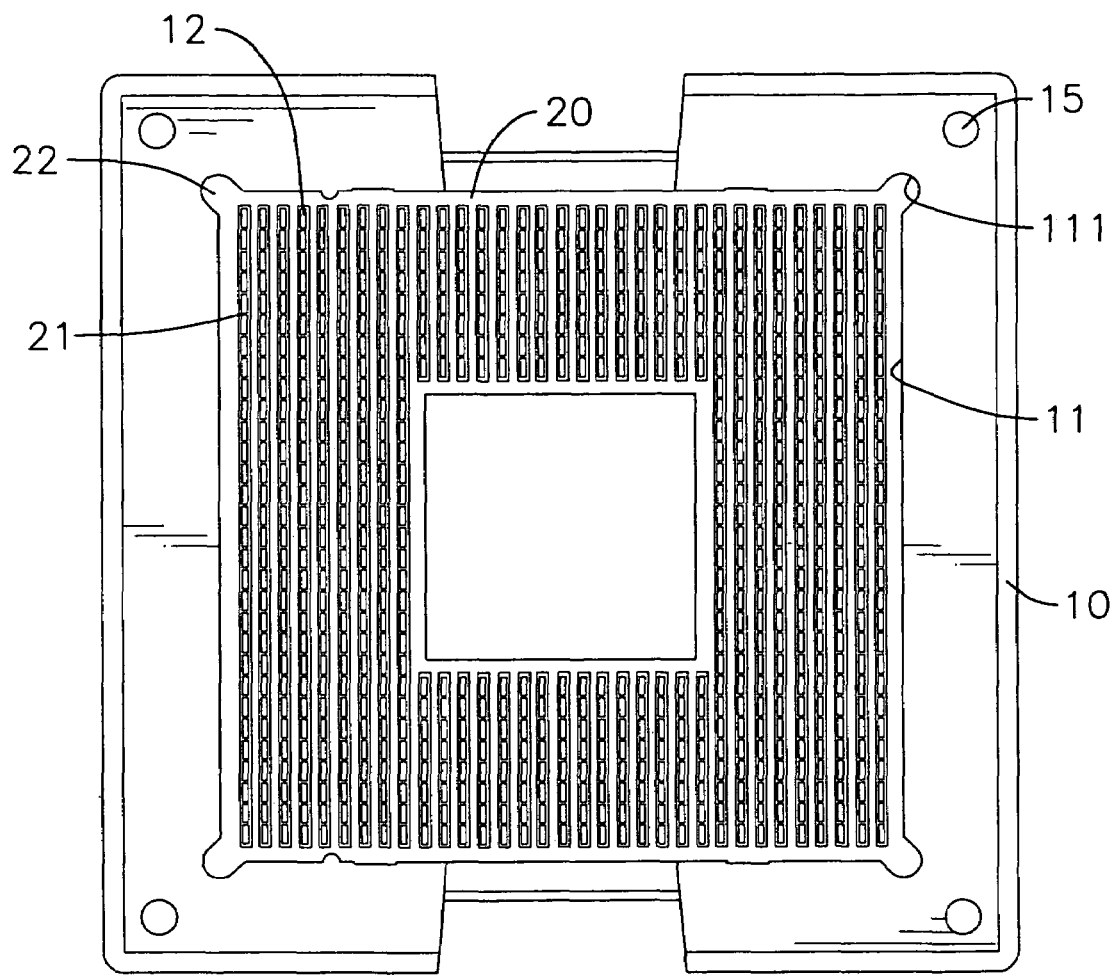
FIG. 2 is a top view of the CPU receptacle in accordance with this invention.
Figure 3:
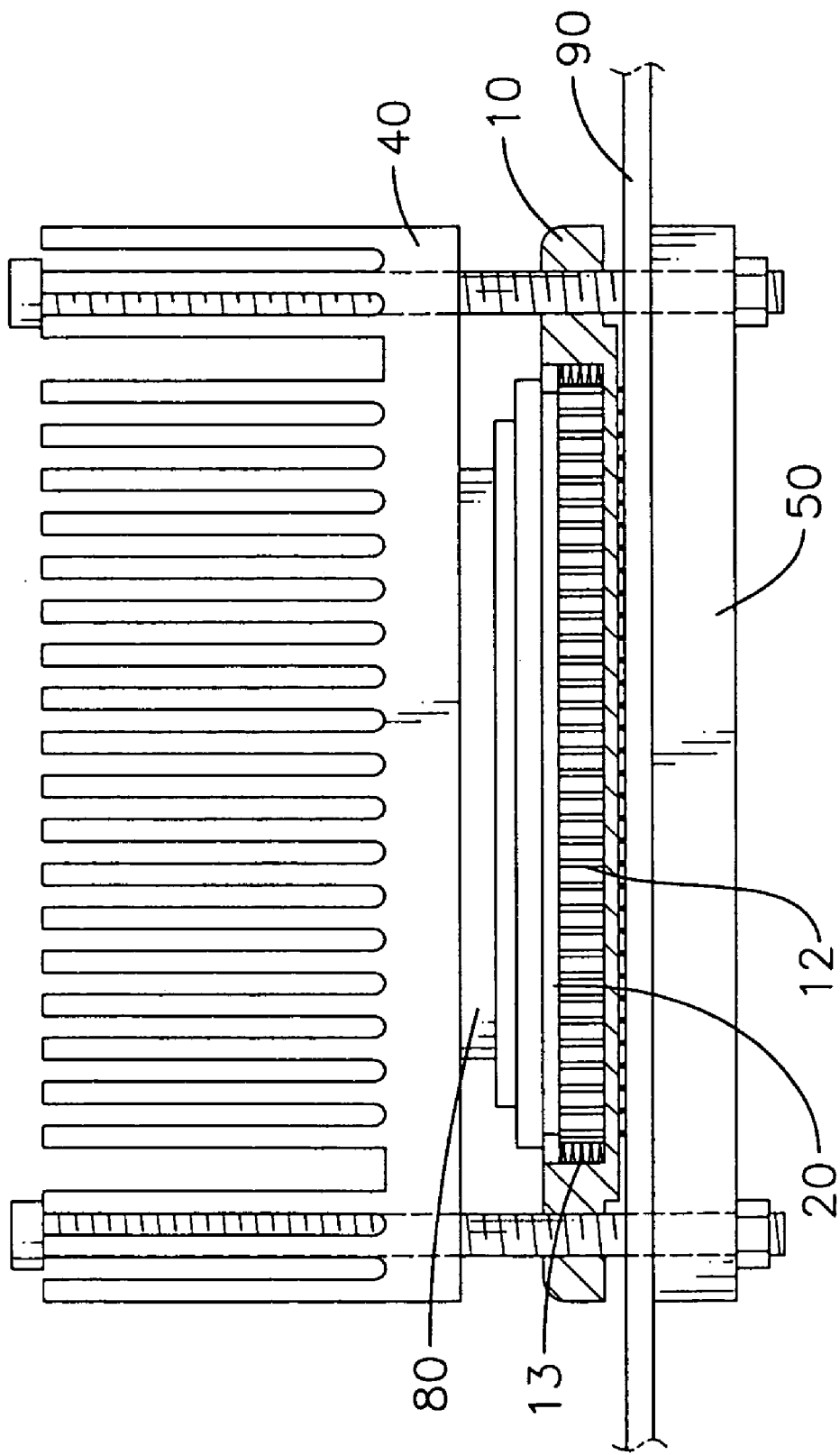
FIG. 3 is a side view of the CPU receptacle in FIG. 1.

With reference to FIG. 1, a CPU receptacle of this invention is mounted on a motherboard (90) with multiple through holes (95) defined therein, and a CPU (80) is received in the receptacle.

The CPU receptacle has a seat (10), a cover (20), a heat sink (30), a plate (50) and multiple fastening members (40).

The seat (10) is mounted on the motherboard (90). Multiple first mounting holes (15) are defined in the seat (10) corresponding to the through holes (95) in the motherboard (90). A recess (11) is defined in the seat (10) and a plurality of rows of flexible metal pins (12) is provided at a bottom of the recess (11). Each row comprises multiple flexible metal pins (12). Multiple apertures (111) are defined in the seat (10) and communicate with the recess (11), and each aperture has a resilient member provided therein, which is a spring (13) in this embodiment.

The cover (20) is mounted on the top of the springs (13), and can slide in the recess (11). Multiple tabs (22) extend from the corners of the cover (20) and correspond to the multiple apertures (111). A plurality of pin slots (21) is defined in the cover (20), to allow corresponding metal pins (12) through.

The heat sink (30) is mounted on the seat (10), contacting the CPU (80) to dissipate heat, and multiple second mounting holes (not numbered) are defined in the heat sink (30) corresponding to the first mounting holes (15) defined in the seat (10).

The plate (50) is made of metal or other hard material and is mounted below the motherboard (90) opposite the seat (10). Multiple third mounting holes (55) are defined in the plate (50) and correspond to the first mounting holes (15) defined in the seat (10).

The heat sink (30) is secured on the seat (10) by the fastening members (40). In this embodiment the fastening members (40) are screws, which are mounted through the second mounting holes, the first mounting holes (15), the through holes (95), the third mounting holes (55). A nut (41) is engaged with each screw (40), whereby the heat sink (30) can closely contact the CPU (80), without having to exert excessive pressure on the motherboard (90).

In this receptacle design, the seat (10) serves as the inner seat of the LGA775 receptacle, and the metal housing is omitted to reduce the cost. In addition, the heat sink (30) serves as the cover of the LGA775 receptacle, but has an additional function of dissipating heat, so the receptacle of this invention can take the place of the conventional LGA775 receptacle and the additional heat sink, and reduce the computer cost accordingly.

It is to be understood, however, that even though numerous characteristics and advantages of the present invention have been set forth in the foregoing description, together with details of the structure and function of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A receptacle for a CPU comprising:
   a seat adapted to be mounted on a motherboard and having a recess defined therein, multiple rows of flexible metal pins provided at a bottom of the recess, and each row comprising a plurality of flexible metal pins and multiple resilient members being provided in the recess;

a cover mounted on a top of the resilient members, and capable of sliding in the recess, with a plurality of pin slots defined in the cover and corresponding to the metal pins at the bottom of the recess;

a heat sink mounted on the seat for contacting the CPU secured in the recess; and multiple fastening members extending through the heat sink and the seat to secure the heat sink on the seat.

2. The receptacle for a CPU as claimed in claim 1, wherein the recess has multiple apertures, and the resilient members are respectively provided in the apertures, and the cover has multiple tabs extended from corners corresponding to the apertures.

3. The receptacle for a CPU as claimed in claim 1, wherein a plate is connected to the seat and adapted to be mounted below the motherboard opposite the seat.

4. The receptacle for a CPU as claimed in claim 3, wherein the plate is made of metal.

5. The receptacle for a CPU as claimed in claim 4, wherein the fastening members are screws, which are mounted through the heat sink, the seat and the plate, and are each engaged to a nut.

\* \* \* \* \*